United States Patent [19]

Savelainen

[11] Patent Number: 5,068,611
[45] Date of Patent: Nov. 26, 1991

[54] MEASURING PROCEDURE FOR THE ELIMINATION OF FAULTS FROM AN NMR SIGNAL BY COMPARING RF FIELD COMPONENTS SPINNING IN OPPOSITE DIRECTIONS

[75] Inventor: Matti Savelainen, Espoo, Finland

[73] Assignee: Instrumentarium Corp., Finland

[21] Appl. No.: 429,281

[22] Filed: Oct. 31, 1989

[51] Int. Cl.$^5$ ............................................. G01R 33/20
[52] U.S. Cl. .................................................. 324/314
[58] Field of Search ............... 324/300, 307, 309, 318, 324/313, 314, 322, 312

[56] References Cited

U.S. PATENT DOCUMENTS

| 4,521,732 | 6/1985 | Pegg et al. | 324/312 |
| 4,684,890 | 8/1987 | Briguet et al. | 324/309 |
| 4,767,990 | 8/1988 | Kahn et al. | 324/309 |

Primary Examiner—Michael J. Tokar
Attorney, Agent, or Firm—Andrus, Sceales, Starke & Sawall

[57] ABSTRACT

An NMR signal measuring method for simultaneously measuring RF field components inducing in RF coils and spinning in opposite directions. The components spinning in opposite directions are measured separately and the measuring results are compared for the elimination of faults.

23 Claims, 1 Drawing Sheet

MEASURING PROCEDURE FOR THE ELIMINATION OF FAULTS FROM AN NMR SIGNAL BY COMPARING RF FIELD COMPONENTS SPINNING IN OPPOSITE DIRECTIONS

The present invention relates to a method for eliminating the effect of faults from an NMR signal.

The existence of nuclear magnetic resonance phenomenon was established experimentally in 1946 by two groups of scientists (Pound, Purcell, Torrey and Bloch, Hansen, Packard). This observation quickly led to a wide application of the phenomenon in physics and organic chemistry.

All nuclei, which have an odd number of protons or neutrons, have an impulse moment or spin different from zero. The nuclei also have a positive electric charge which, together with the spin of a nucleus, provides the nucleus with a magnetic moment whose direction coincides with that of the spin axis of the nucleus. A field generated by the magnetic moment of a nucleus can be approximated by the field of a magnetic dipole.

If a sample containing a large number of nuclei is placed in a static magnetic field, the magnetic moments of nuclei tend to align themselves with the direction of an external magnetic field and the sample is provided with a net magnetization in the direction of the external magnetic field. The net magnetization has a magnitude which is proportional to the number of nuclei in a sample and to the strength of an external magnetic field. The orientation of nuclei is disturbed by the thermal movement of nuclei, so the magnitude of magnetization is also affected by the sample temperature: As temperature rises, magnetization diminishes.

In terms of quantum mechanics, the events can be described in a manner that an external magnetic field produces a number of energy levels depending on the spin quantum number (I) of a nucleus, on which levels the nucleus can set in a certain probability. The nucleus of a hydrogen atom or the proton has a spin quantum number of $I=\frac{1}{2}$, so the proton can set on two energy levels, either in a manner that the direction of its magnetic moment is the same as that of the external magnetic field or opposite to that. Of these two, the former is more likely and the occupation proportions of the energy levels conform to the so-called Boltzmann distribution. In order to transfer from one energy level to another the nucleus either takes up or delivers an energy quantum as electromagnetic radiation of a certain frequency. The radiation frequency is determined by the difference between energy levels which is directly proportional to the strength of an external magnetic field. The frequency associated with energy exchange is called Larmor frequency and this energy exchange between nucleus and environment is called a nuclear magnetic resonance phenomenon. The principles of nuclear magnetic resonance have been studied e.g. in the following references: Abragam A: The principles of nuclear magnetism, London Oxford University Press, 1961 and Slichter CP: Principles of magnetic resonance, Berlin, Springer Verlag, 1981.

The nuclear magnetic resonance phenomenon has been studied by so-called continuous radiation (CW, Continuous wave) and pulse methods. Pulse methods have been found more effective than CW methods and are thus employed in NMR spectroscopy and so-called nuclear spin imaging. In pulse methods, a sample is subjected to a Larmor frequency electromagnetic pulse having a duration determined in a manner that the nuclear magnetization of a sample rotates through a desired angle (theta) relative to the direction of an external magnetic field. The amplitude and duration of an electromagnetic pulse is generally selected in a manner that (theta) is a multiple of 90 degree. Generally used terms are 90-degree and 180-degree pulses etc.

After the excitation procedure, a net magnetization $M_n$ deviated from the direction of a basic magnetic field $B_o$ precesses at Larmor frequency $w_o$ around the direction of $B_o$. This can be verified by placing outside a sample a coil in a manner that its magnetic axis is prependicular to the direction of $B_o$. The precessing net magnetization induces in the coil a so-called FID signal (Free Induction Decay), which has a Larmor frequency and an amplitude that is proportional to the strength of the nuclear magnetization of a sample or the number of nuclei and to the strength of an external magnetic field.

Pulse methods associated with nuclear magnetic resonance tests have been studied e.g. in the following references: Farrar TC, Becker ED: Pulse and Fourier Transform NMR—Introduction to Theory and Methods, New York, Academic Press, 1971 and Ernst RR, Anderson WA: Application of Fourier Spectroscopy to magnetic resonance, Rev. Sci Instrum, vol 37, No. 1, 1966.

During the excitation process, the nuclear system takes up external energy from the exciting radio frequency field and, after the excitation, delivers it to its environment. The delivery of energy may occur as a coherent radiation that can be detected by an external coil or the energy may transfer into the structure of a sample to serve as thermal movement. During the delivery of energy, the net magnetization of a sample returns to its rest value. In view of the invention, it should be appreciated that the nuclear system only emits an electromagnetic field spinning in just one direction (the direction depends on that of the magnetic field).

Generally, an RF signal is not further processed as such but, instead, there is effected a detection or mixing to a low frequency. By effecting the detection using a so-called quadrature detection it is possible to retain also the phase information of a detected signal complete. The detected signal is thus complex and the mathematical operations subsequently effected thereon must be accordingly performed with complex numbers.

The following figures accompanying the specification will be of assistance in understanding the invention sought to be patented. In the figures.

Figure 1:
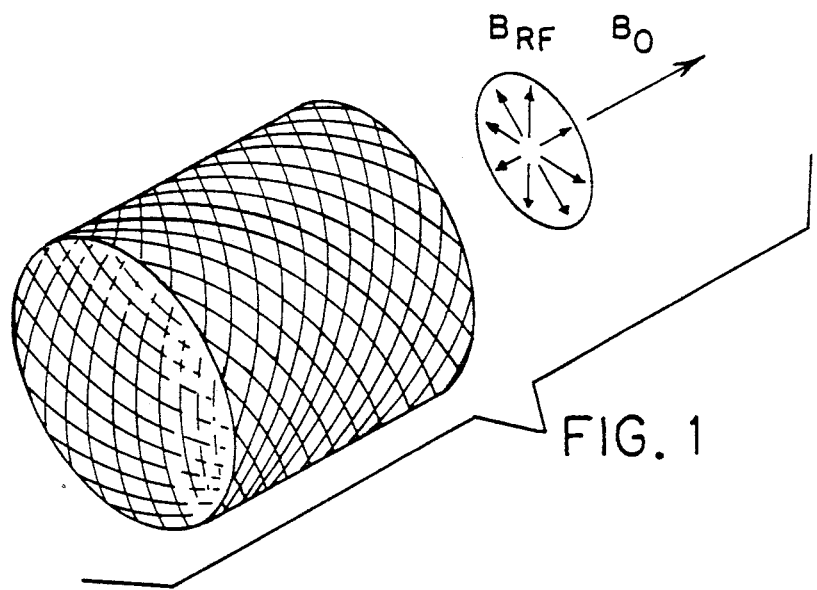
FIG. 1 is a schematic showing of NMR coils for obtaining NMR signals.
Figure 2:
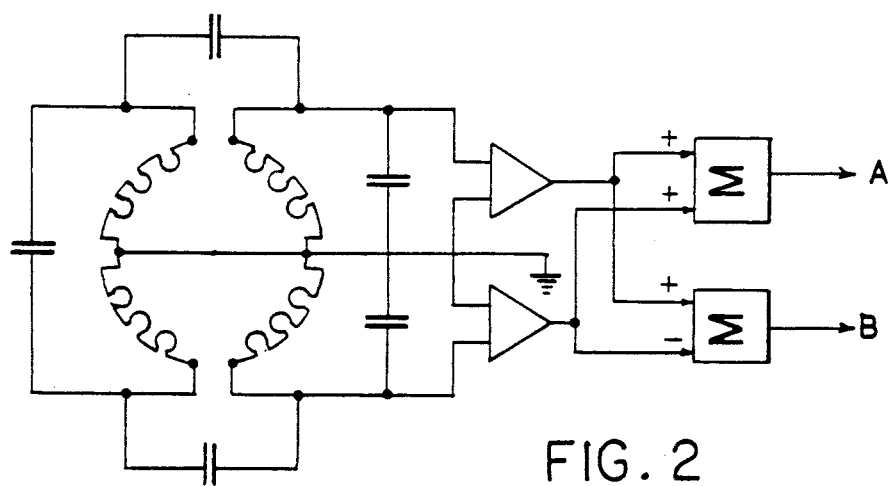
FIG. 2 is a schematic diagram showing circuitry connected to the coil of FIG. 1.
Figure 3:
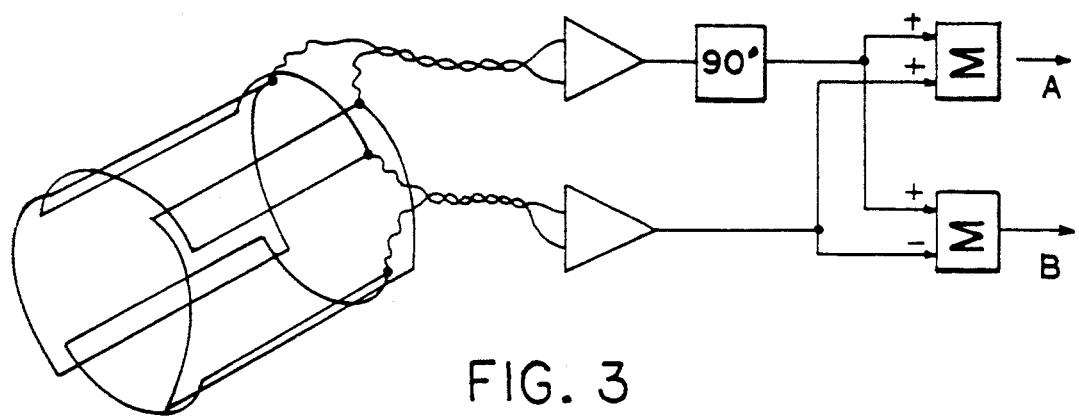
FIG. 3 is a schematic diagram of circuitry associated with the RF coil.

It is possible to simultaneously detect spinning RF fields of different directions and as it is also possible to know in which direction of a spinning RF field the nuclear system is emitting, the inappropriate fault moments can be eliminated from the signal. FIG. 1 illustrates a cylindrical and symmetric set of coils which can be coupled in a manner that there is only coupled to a preamplifier a voltage induced by the RF field spinning in one of the directions, said coupling being at the excited frequency (see U.S. Pat. No. 4,712,068 to the present inventor). If, as shown in FIG. 2, the coupling is effected on the same coil, it is possible to simultaneously excite different outputs A and B to become sensitive to the fields spinning in different directions. This coupling and this type of coil is just one of the many possibilities to simultaneously detect RF field components of different directions. The most simple case is shown in FIG. 3. The signals induced in two orthogonal coils (e.g. saddle coils) are amplified and a 90-degree phase shift is created in one of the signals, whereafter the signals are summed up and subtracted from each other (A and B channel).

When it is known that e.g. a signal coming out of channel A is spinning the right way, the following conclusions can always be made:
- if there is a signal in channel B, its source is not a precessing spin system
- if the source of a signal induced in channel B was linearly polarized, this equal component is also present in channel A
- the signals produced in channels A and B of a linearly polarized RF field differ from each other with a phase angle which depends on the direction of said linearly polarized RF field.

Generally, all sources of fault only emit linearly polarized RF field. Now, by utilizing the fault information of channel B, all the faults of burst nature can be eliminated from the signal. In addition, the faults occurring at fixed frequencies can be identified and eliminated after Fourier transform. It is also possible to eliminate faults from the image data made up from NMR signals. The fault amplitude information of an image calculated from signals out of channel B, when combined with a correct signal phase obtained from channel A, will be sufficient for a complete identification of faults from the image except sign information. A calculation of the phase of a correct signal can be effected as it is known that the phase variation in image level is a regular and slowly changing function and, in addition, the phase is also analytically calculable as inhomogeneity of a magnetic field is known. The correct sign of the amplitude of a fault is selected on the basis of averaging or the correlation of image data.

Various modes of carrying out the invention are contemplated as being within the scope of the following claims particularly pointing out and distinctly claiming the subject matter which is regarded as the invention.

I claim:

1. A method for eliminating faults in an NMR signal of an object, said NMR signal being derived from RF signals developed in at least a pair of RF coils, said RF signals including an RF signal component rotating in a given direction and developed as a result of the precession of the net magnetism of the sample about an axis of a polarizing magnetic field applied to the sample, and said RF signals including a component arising from faults, said method comprising the steps of:
    simultaneously detecting components of the RF signals developed in the RF coils and rotating in opposite directions;
    measuring the amplitude of the detected RF signal components;
    utilizing the signal data so obtained to identify faults existing in the RF signal component produced by the net magnetism precession; and
    eliminating the identified faults from the NMR signal derived from the RF signal component produced by the net magnetism precession.

2. A method as set forth in claim 1 wherein each of the RF signal components is measured in a separate channel and wherein when the amplitude of the measured component in the channel containing the component arising from faults exceeds a set limit, the steps of detecting and measuring the RF components are repeated.

3. A method as set forth in claim 1 wherein each of the RF signal components is measured in a separate channel wherein the amplitude of the measured component in the channel containing the component arising from faults is integrated, and wherein when the integrated amplitude of the measured component in the channel containing the component arising from faults exceeds a set limit, the steps of detecting and measuring the RF components are repeated.

4. A method as set forth in claim 1 wherein each of the RF signal components is measured in a separate channel, wherein the amplitude of the measured component in the channel containing the component arising from faults is measured on an RMS basis, and wherein when the RMS amplitude of the measured component in the channel containing the component arising from faults exceeds a set limit, the steps of detecting and measuring the RF components are repeated.

5. A method as set forth in claim 1 wherein the amplitude measuring step is further defined as including averaging signal measurements, wherein each of the RF signal components is measured in a separate channel, wherein the amplitude of the measured component in the channel containing the component arising from faults is measured on an RMS basis, and wherein when the RMS amplitude of the measured component in the channel containing the component arising from faults exceeds a set limit, the step of measuring the RF components includes averaging signal measurements.

6. A method as set forth in claim 1 wherein the amplitude measuring step is further defined as including averaging signal measurements, wherein each of the RF signal components is measured in a separate channel, wherein the amplitude of the measured component in the channel containing the component arising from faults is measured on an RMS basis, and wherein when the RMS amplitude of the measured component in the channel containing the component arising from faults exceeds a set limit, the step of measuring the amplitude of the RF components includes averaging signal measurements in the channel containing the component produced by the net magnetism precession and averaging signal measurements in excess of said set limit in the channel containing the component arising from faults.

7. A method as set forth in claim 1 wherein each of the RF signal components is measured in a separate channel and wherein the amplitude of the measured component in the channel containing the component arising from faults is measured on an RMS basis, and wherein when the RMS amplitude of the measured component in the channel containing the component arising from faults exceeds a set limit, the signal measurement in excess of said set limit in the channel containing the component arising from faults is processing the following steps:
    varying the phase of the component arising from faults in excess of the set limit;
    determining the difference between the components in the two channels which is in varying phase;
    finding the smallest variation from the determined difference while continuing the variation; and
    substituting the determined component difference giving the smallest variation for the component in the channel containing the component produced by the net magnetism precession.

8. A method as set forth in claim 1 including the step of carrying out a Fourier transform on the detected components, wherein each of the RF signal components is measured in a separate channel, wherein the amplitude of the measured component in the channel containing the component arising from faults is measured on an RMS basis, and wherein when the RMS amplitude of the Fourier transformed component at a selected frequency in the channel containing the component arising from faults exceeds a set limit, the steps of detecting and measuring the RF components are repeated.

9. A method as set forth in claim 1 wherein the amplitude measuring step is further defined as including averaging signal measurements, wherein the method includes the step of carrying out a Fourier transform on the detected components, wherein each of the RF signal components is measured in a separate channel, wherein the amplitude of the measured component in the channel containing the component arising from faults is measured on an RMS basis, and wherein when the RMS amplitude of the Fourier transformed component at a selected frequency in the channel containing the component arising from faults exceeds a set limit, the step of measuring the RF components includes averaging signal components.

10. A method as set forth in claim 1 wherein the amplitude measuring step is further defined as including averaging signal measurements, wherein the method includes the step of carrying out a Fourier transform on the detected components, wherein each of the RF signal components is measured in a separate channel, wherein the amplitude of the measured component in the channel containing the component arising from faults is measured on an RMS basis, and wherein when the RMS amplitude of the Fourier transformed component at a selected frequency in the channel containing the component arising from faults exceeds a set limit, the Fourier transformed detected components are replaced, for the limit-exceeding frequency band, in both channels with averages of the Fourier transformed components.

11. A method as set forth in claim 1 wherein the method includes the step of carrying out a Fourier transform on the detected components, wherein each of the RF signal components is measured in a separate channel, wherein the amplitude of the measured component in the channel containing the component arising from faults is measured on an RMS basis, wherein when the RMS amplitude of the Fourier transformed component at a selected frequency in the channel containing the component arising from faults exceeds a set limit, the Fourier transformed detected components are replaced, for the limit exceeding frequency band, in the channel containing the component produced by the net magnetism precession with a Fourier transformed signal determined from the following steps:

varying the phase of the Fourier transformed component arising from faults;

determining the difference between the Fourier transformed components in the two channels which is in varying phase;

finding the smallest variation from the determined difference while continuing the variation; and substituting the determined component difference giving the smallest variation for the component in the channel containing the component produced by the net magnetism precession.

12. The method as set forth in claim 2 further defined as setting the limit value in dependence on the signal in the other channel.

13. The method as set forth in claim 3 further defined as setting the limit value in dependence on the signal in the channel containing the component produced by net magnetism precession.

14. The method as set forth in claim 4 further defined as setting the limit value in dependence on the signal in the channel containing the component produced by net magnetism precession.

15. The method as set forth in claim 8 further defined as setting the limit value in dependence on the signal in the channel containing the component produced by net magnetism precession.

16. The method as set forth in claim 10 further defined as setting the limit value in dependence on the signal in the channel containing the component produced by net magnetism precession.

17. The method as set forth in claim 1 wherein each of the RF components is measured in a separate channel and wherein the method is further defined as producing an NMR image and including the steps of:

producing first pixel image data from the RF component in the channel containing the component produced by the net magnetic precession;

producing second pixel image data from the RF component in the channel containing the component arising from faults; and subtracting the second pixel image data from the first pixel image data in producing the NMR image.

18. The method as set forth in claim 1 wherein the step of measuring the RF components is further defined as amplifying the detected signals and as summing and subtracting the signals obtained from the RF coils.

19. The apparatus according to claim 1 wherein the method is further defined as providing a pair of RF coils positioned, with respect to each other, to provide a phase difference in the detected RF components.

20. A method as set forth in claim 1 wherein each of the RF signal components is measured in a separate channel and wherein when the amplitude of the measured component in the channel containing the component arising from faults exceeds a set limit, the step of measuring the RF components includes the step of substituting predetermined values for the measured values.

21. A method as set forth in claim 1 wherein each of the RF signal components is measured in a separate channel, wherein the amplitude of the measured component in the channel containing the component arising from faults is measured on an RMS basis, and wherein when the RMS amplitude of the measured component in the channel containing the component arising from faults exceeds a set limit, the step of measuring the RF components includes the step of substituting predetermined values for the measured values.

22. A method as set forth in claim 1 wherein the amplitude measuring step is further defined as including averaging signal measurements, wherein the method includes the step of carrying out a Fourier transform on the detected components, wherein each of the RF signal components is measured in a separate channel, wherein the amplitude of the measured component in the channel containing the component arising from faults is measured on an RMS basis, and wherein when the RMS amplitude of the Fourier transformed component at a selected frequency in the channel containing the component arising from faults exceeds a set limit, the step of measuring the RF components includes the step of substituting predetermined values for the measured values.

23. A method as set forth in claim 1 wherein the amplitude measuring step is further defined as including averaging signal measurements, wherein the method includes the step of carrying out a Fourier transform on the detected components, wherein each of the RF signal components is measured in a separate channel, wherein the amplitude of the measured component in the channel containing the component arising from faults is measured on an RMS basis, and wherein when the RMS amplitude of the Fourier transformed component at a selected frequency in the channel containing the component arising from faults exceeds a set limit, the Fourier transformed detected components are replaced, for the limit-exceeding frequency band, in both channels with preselected Fourier transformed component values.

* * * * *

UNITED STATES PATENT AND TRADEMARK OFFICE
CERTIFICATE OF CORRECTION

PATENT NO. : 5,068,611
DATED : November 26, 1991
INVENTOR(S) : MATTI SAVELAINEN It is certified that error appears in the above-identified patent and that said Letters Patent is hereby corrected as shown below:

Title page, item

[30]    FOREIGN APPLICATION PRIORITY DATA    insert--

October 31, 1988 [FI]  Finland....884996 --.

Signed and Sealed this

Ninth Day of November, 1993

Attest:

BRUCE LEHMAN

*Attesting Officer*     *Commissioner of Patents and Trademarks*